United States Patent [19]

Marks

[11] Patent Number: 5,268,258

[45] Date of Patent: Dec. 7, 1993

[54] MONOMOLECULAR RESIST AND PROCESS FOR BEAMWRITER

[76] Inventor: Alvin M. Marks, 359 R Main St., Athol, Mass. 01331

[21] Appl. No.: 297,948

[22] Filed: Jan. 17, 1989

Related U.S. Application Data

[63] Continuation-in-part of Ser. No. 1,330, Jan. 2, 1987, Pat. No. 4,798,959.

[51] Int. Cl.$^5$ .............................................. G03C 5/00
[52] U.S. Cl. .................................................... 430/296
[58] Field of Search .................... 430/296; 156/603, 79

[56] References Cited

U.S. PATENT DOCUMENTS

| | | | |
|---|---|---|---|
| 2,883,257 | 4/1959 | Wehe | 430/296 X |
| 3,462,762 | 8/1969 | KasPaul et al. | 430/296 |
| 3,620,833 | 11/1971 | Gleim et al. | 430/296 X |
| 3,772,056 | 11/1973 | Polichette et al. | 430/296 X |

Primary Examiner—Marion E. McCamish
Assistant Examiner—Mark A. Chapman

[57] ABSTRACT

A process for the manufacture of submicron circuits uses a submicron beam writer having multiple beams to Inscribe simultaneously a plurality of metal patterns onto a glass surface having a monoatomic or monomolecular resist. The beams produce a plurality of charged double layers constituting the pattern. Metal is deposited according to the pattern. The pattern may have metal strips with 20 to 100 A gaps coated with different materials having different work functions on opposing gap-faces, forming tunnel junctions acting as diodes. The patterns may be costed with Insulating coatings. The manufacturing equipment, chemistry and processes for manufacturing these sheet products are described. The sheet products may be employed as a light-electric power converter (LEPCON TM); or, in reverse with electric power supplied, as a large area laser, (ELCON TM) used for 2D or 3D displays, for a high density high speed computer matrix and for a variety of uses.

3 Claims, 4 Drawing Sheets

PROCESS B

PROCESS A

PROCESS B

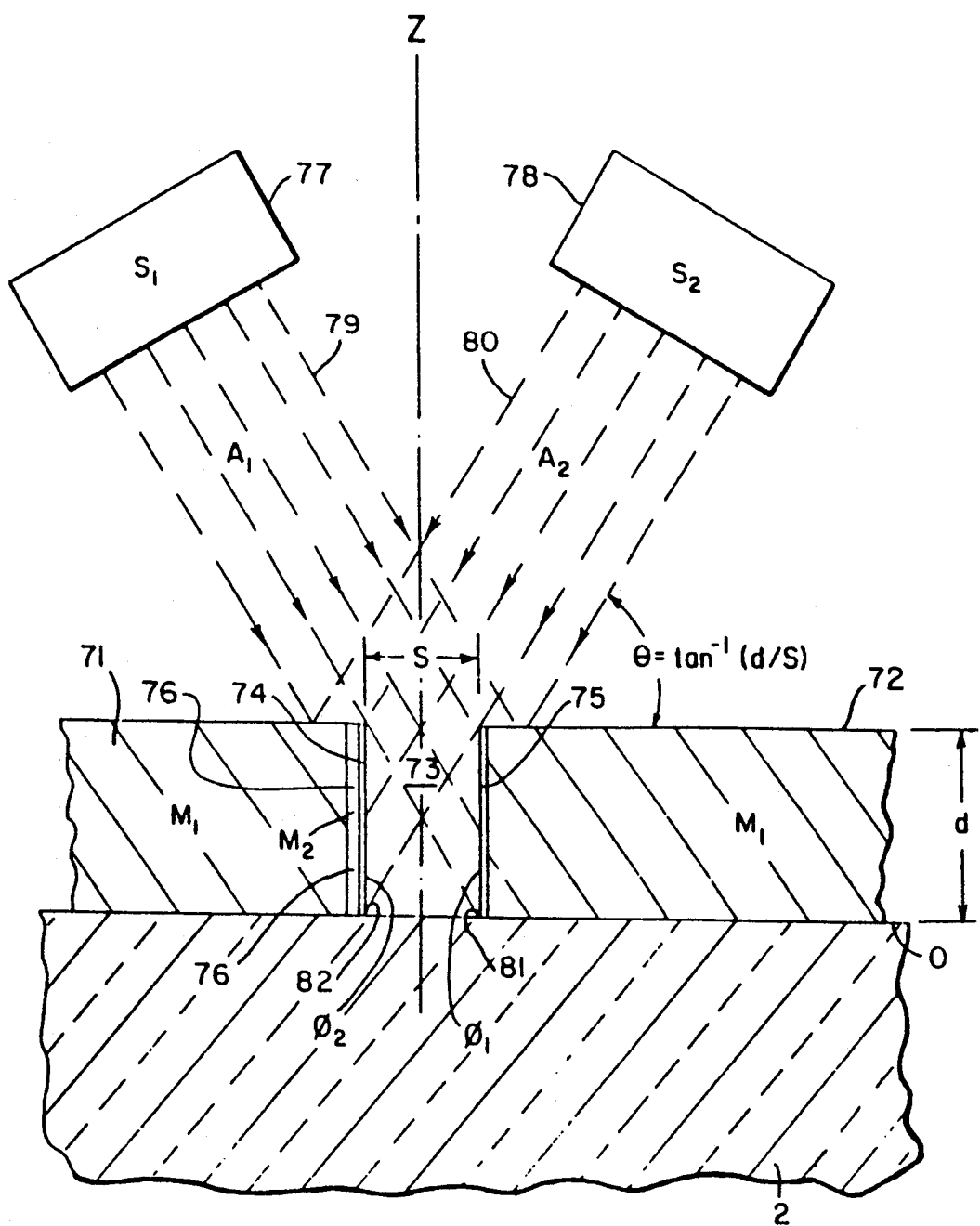

MONOMOLECULAR RESIST AND PROCESS FOR BEAMWRITER

CROSS REFERENCES TO RELATED APPLICATIONS

This is a Continuation in Part of U.S. Ser. No. 001,330 filed Jan. 2, 1987 entitled Super Submicron Electron Beam Writer issuing Jan. 17, 1989 as U.S. Pat. No. 4,798,959, the subject matter of which is herein included in whole or in part by reference.

There is no earlier patent or patent application on this subject. The present invention resulted from the need for the high speed low cost manufacture of submicron devices such as described in U.S. Pat. No. 4,445,050 entitled "Device for the Conversion of Light Power to Electric Power" issued Apr. 24, 1984 to Alvin M. Marks, and U.S. application Ser. No. 637, 405 entitled "Femto Diode and applications" filed Aug. 3, 1984 by the same inventor. The latter disclosed an improved LEPCON TM light-electric power converter, and ELCON TM electric-light power converter or laser, and other devices including 2D and 3D displays, high-speed compact supercomputers, etc.

The U.S. application Ser. No. 637, 405 issued as U.S. Pat. No. 4, 720, 642 on Jan. 19, 1988.

BACKGROUND OF THE INVENTION

1. Field of the Invention

This invention relates to a novel monoatomic or monomolecular resist for use with a beam writer for the production of high resolution submicron circuit patterns on an insulating substrate.

2. Description of the Prior Art

The State of the Art of "Nanometer-Scale Fabrication" has been given with an excellent bibliography, as of 1982 [1]; wherein, it is stated on p. 3:

"... electron, ion and X-ray exposure, ... limitations of the resist ... not those of the exposure system ... set the ultimate limit on ... resolution"; and:"The most commonly used resist for high resolution (<100 nm or 1000A) is (PMMA) polymerthylmethacrylate. A resolution of <50 nm or 500 A may be obtained with other resists ... not well studied. "; and:"exposure of PMMA with a high intensity 50 kV field-emission electron beam source with a 20 nm. beam of $10^{-7}$ amps ... takes 1 day (86, 400 sec. ) to expose a dense pattern on a 4" square (100 cm.$^2$ or $10^{-2}$ m$^2$), with additional time for stage motion and alignment."

This is a speed of about $10^{-7}$m$^2$sec; and a resolution of only 500 A.

The use of reactive ion etching to produce localized probes 1000A apart is reported [2] but this resolution is also small enough, and there is no increase in speed.

For the manufacture of Lepcon TM, Elcon TM and such devices this speed is too small; and the resolution not small enough. A speed of about 0. 1 m$^2$sec and a resolution of 10A is required, not obtainable with these prior art devices.

A 10A resolution is reported [3]:

."Using a ½nm (5A) diam beam of 100 keV electron, we have etched lines, holes and patterns in NaCl crystals at the 2 nm. (20A) scale size. Troughs about 1. 5 nm. wide on 4. 5 nm centers and 2 nm dia holes have been etched completely through NaCl crystals more the 30 nm thick. " and "The scanning transmission electron microscope (VG Microscopes, Ltd. , Model HB5) in operation in the National Research and Resource Facility for Submicron Structures at Cornell University can produce up to 1 nA of 100 key electron in a beam dia as small as ½nm (5A). This beam current density of ½×10$^6$A/cm$^2$ means that it takes only 10μs to deposit a dose of 5 coulombs/cm$^2$ in the sample." and "Two types of materials ... alkali halides and aliphatic amino acids ... can easily be vacuum sublimated or evaporated as uniform thin films ... readily vaporized by electron beams. Using 100 key electrons a dose of about $10^{-3}$ C/cm$^2$ is sufficient to etch through 30 nm of L-glycine, while a dose of $10^2$ C/cm$^2$ is needed to etch through a similar thickness of NaCl."

In the latter reference the resolution is satisfactory but the speed is too slow.

Recently (1986) there has been a report on a new X-Ray lithography device [4]. This article stated:

Submicron lithography "using storage ring Xray sources may be closer ... volume production ... 1990's. A compact synchroton storage ring will be mated with a vertical stepper ... will produce 12A wavelength at 630 MeV energy level. When MTED TO TILE COST storage ring, the XRS should have a resolution of 0.2μm (2000A) ... alignment accuracy to within 0.1 μm (1000A). The stepper will expose wafers up to 8 in. (0.2 m) dia.

A Field-Emission Scanning Transmission Microscope (STEM) has been described [5, 8]. A field emitter is employed to produce an emission area having a diameter of 30-300 A. One magnetic lens with a short focal length and low spherical aberration, is used to demagnify this source to a resolution of 2 to 5A on the specimen surface. The field emission gun and lens is mounted in an ultrahigh vacuum vessel that operates, at $10^{-8}$ to $10^{-7}$ Pa. When a short focal length lens is utilized to keep the system compact, aberration may be compensated by a "atigmator".

In these Prior Art Devices the speed is too slow for the rapid production of devices for the Lepcontm TM - Elcon TM Technology hereinabove specified.

SUMMARY OF THE INVENTION

DEFINITIONS

ELCON TM A trademark for a submicron array of dipole antennae on a sheet which emits light photon power by transducing the equivalent input electrical power from a direct electric current input; thus directly converting input electric power per unit area to output light, power per unit area(watts/m$^2$). The light is emitted from the sheet as a parallel laser beam of a particular color or frequency, With its alectric vector parallel to the long axis of the antenna.

LEPCON TM A trademark for a submicron array of dipole antennae capable of receiving and transducing light photon energy $\epsilon = hv$ into its equivalent electron energy $\epsilon = Ve$ as direct current; thus directly converting light power per unit area (photons/sec-m$^2$) to electric power per unit area (watts/m$^2$). Randomly polarized light photons are resolved. Two orthogonal antennae arrays totally absorb and transduce the randomly oriented incident photons. In bright sunlight the electric power output is about 500 watts at 80% efficiency.

SUPERSEBTER TM An acronym for Super Submicron Electron Beam Writer for the rapid fabrication of submicron arrays for LEPCON ™ or ELCON ™ devices, or other submicron circuits.

Strip: A metal electrical conductor coated or deposited on an insulating surface in the shape of a long narrow parallelpiped.

OBJECTS OF THE INVENTION

Objects of this invention are to provide a process and an apparatus for the manufacture of submicron circuits which has:

1. a high speed (about 0. 1 n²/s)
2. a large area (1 m²)
3. a high resolution (less than about 5 A).
4. a low cost (less than $250. 00/m²-1986 prices.

SUMMARY

The present device may be employed for the rapid manufacture of submicron circuits as hereinabove set forth.

These devices comprise single crystal metal strips of Copper, Aluminum, or the like; in which, an energetic electron provided by direct conversion from photon energy travels freely in the metal for distances of about 10, 000 A without collision with an impurity atom; and, hence without energy loss.

The strips may be for example 600 A long, separated by a "tunnel-junction" gap of 28-35 A. the width of the strip may be, for example, 30 A.

In the formation of this structure a single scan with a 30 A dia. electron beam may be used. The electron beam is preferably shaped with a square or rectangular section to provide a constant gap of about 30 A between successive in-line strips.

1. A small diameter image is formed from the electron emitter array by a demagnifying lens.
2. One or two long focus electron lenses of the magnetic or electrostatic type are used resulting in negligible aberration.
3. A large aperture lens may be used: to 30 mm.
4. The focal length of the lens if 2. 5 m to 20 m, compared to about 2. 5 mm in a standard SEM.
5. A plurality of images of the electron emitter array is simultaneously imaged onto the work surface.
6. Writing speed is increased by the simultaneous scanning with a plurality of electron beams. For example: $2 \times 10^9$ electron beams are scanned simultaneously to imprint the same number of identical patterns.
7. The pattern is imprinted by an electron beam impinging on a surface coated with a monoatomic or monomolecular layer, which may comprise an electric double layer. The electron beam breaks the chemical bonds, changes the chemical or electrical characteristics, or ablates the layer. Prior art masking layers were usually about 300 A thick. The layer used herein is only ½% to 10% of the thickness of prior art coatings. Consequently the present method is more efficient than prior art methods, requiring considerably less electron beam energy per unit area.

BRIEF DESCRIPTION OF THE DRAWINGS

FIG. 0 shows a cross section through a plate surface having no free electric surface charges.

DESCRIPTION OF THE PREFERRED EMBODIMENTS

Figure 7:
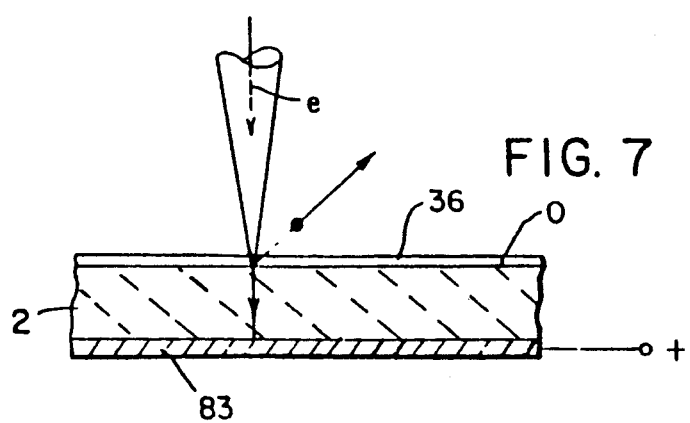
FIG. 7 diagrammatically shows the generalized process steps of submicron pattern deposition along a production line on the OX axis of the Supersebter ™, according to Process A.
Figure 8:
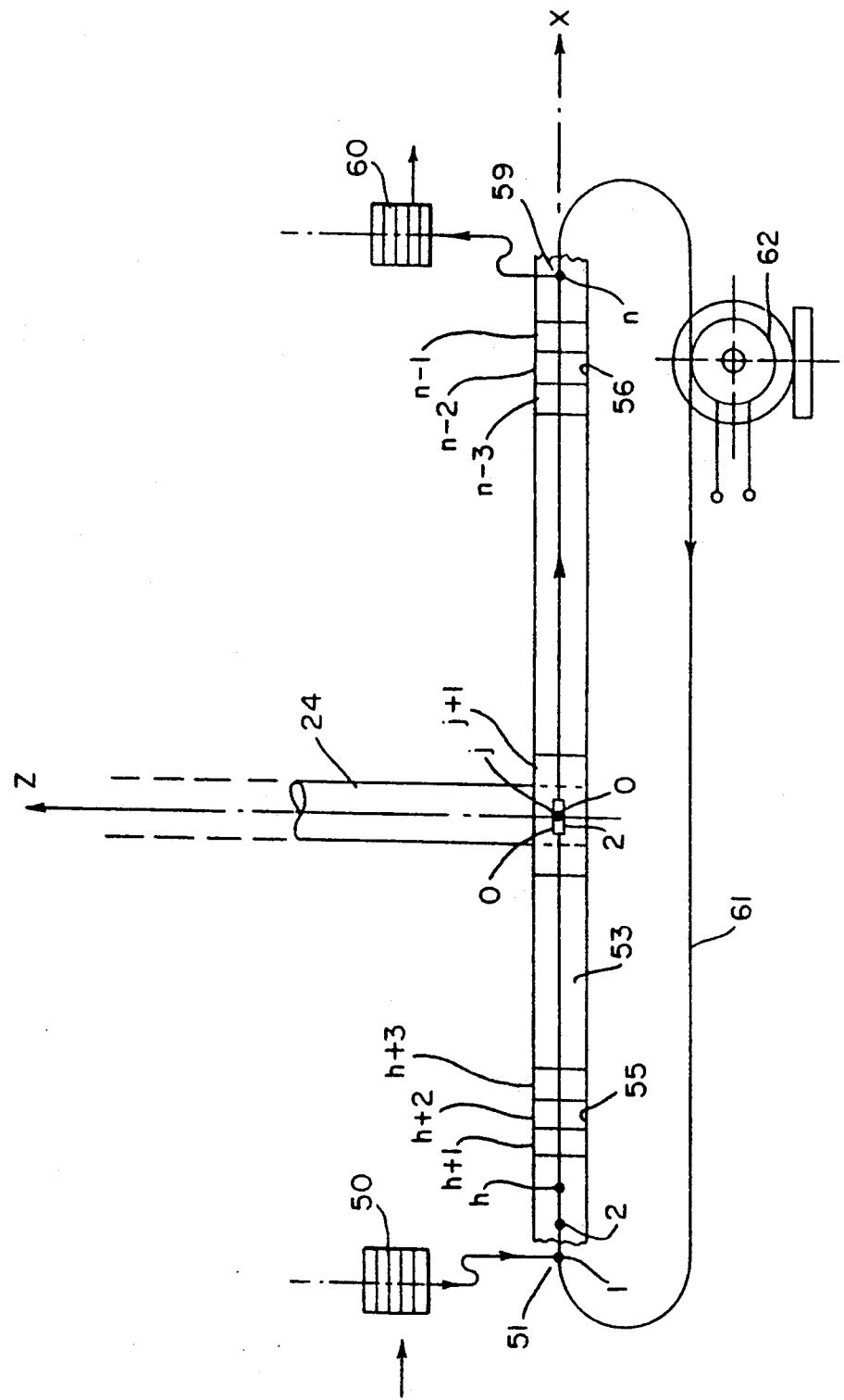
FIG. 8 diagrammatically shows the generalized process SLEPS of submicron metal pattern deposition along a production line on the OX axis of the Supersebter ™, according to Process B.

Generalized production processes for the manufacture of submicron circuits on a plurality of substrate sheets are shown diagrammatically in FIGS. 7 and 8. The main or first vacuum tube 24 of the Supersebter ™ is along the OZ axis. One or wore vacuum tubes 53, 54 and atmospheric pressure processing stations 51, 52 are located along the OX axis The Production line 61, driven by the stepping motor 62 enters from the left at Station 1, and leaves at 59, Station n, to finished sheet inventory, circulating continuously. In the two production processes described herein, Process A and Process B, substrate sheets, usually glass plates, are supplied from stock 50 to a production line 61. Both Processes include the step of electron beam writing a pattern on the surface of the sheet using the Supersebter ™ electron beam writer described herein.

In the generalized process, Station x refers to a processing step at position x. Referring to FIG. 7, the substrate sheet is loaded from stock 50 onto the production line 61 at Station 1. Several processes, hereinafter described, may be employed at atmospheric pressure from Stations 2 to h. The sheet enters the second tube 53 through the first air locks at Stations h+1, h+2, h+3; respectively, the first low, medium and high vacuum airlocks 55. Vacuum treatment steps are located from Stations h+4 to Station j−1. The electron beam writing step, located t Station j, creates a pattern on the surface of the sheet. This pattern may include a gap for example 25 to 100A, used for an asymmetric tunnel junction. Further treatment steps may occur at Stations j+1 to k−3. Stations k−2 to k are second airlocks 56, which restore the sheets to atmospheric pressure. In Process B Stations k+1 to m−1 at 52 are at atmospheric pressure for several wet process steps such as the application of electroless metal sensitizing and metal deposition solutions, rinsing and drying.

Next, the sheets may enter airlocks 57 at m, m+1 and m+2. At Station m+3 the deposited metal may be crystallized to single crystal areas, as described in section 08.5 herein. The, using the ion-coating device shown in FIG. 38, the metal pattern is coated with high and low work function materials respectively at opposite faces of a gap in the deposited metal pattern. At Station m+5 the entire pattern is coated with an insulator coating as described in Section 08.7. After passing through the fourth airlocks 58 at Stations n−3, n−2, n−1, n the sheets pass from the third tube into the atmosphere and is removed from the production line to finished sheet inventory 60. The production line 61 circulates back to the start, and the process is intermittently continuous.

Two basic Processes A and B are described below:

PROCESS A

Figure 9:
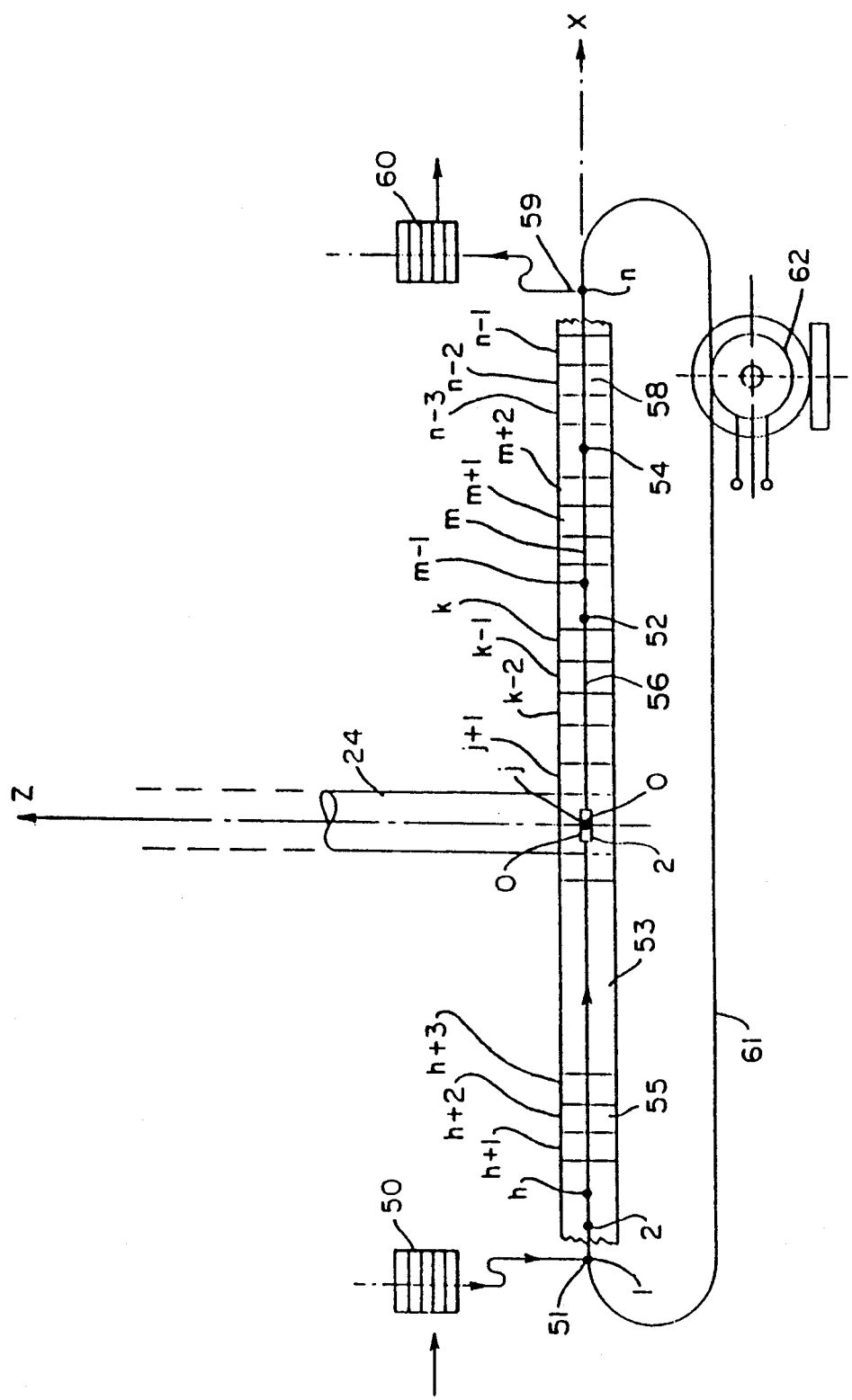
FIG. 9 diagrammatically shows an Ion Beam Coater.

FIG. 7 shows a device employing Process A: the first vacuum tube 24 of the electron beam writer joins the production-line second vacuum tube 52 in a T section. Process A takes place entirely within the second vacuum tube 53. The substrate sheets enter at Station 2, being processed before and after the electron beam writing step at Station j, and leaving at Station n as finished sheets, An example of the processing steps which may occur at the various Stations follows:

11. The sheets enter the airlocks at stations h+1 to h+3.
12. At Station h+4 the sheets are heated to 700° C. and Argon-plasma cleaned to de-gas their surface.
13. The surface chemistry may be changed by ions implanted into the surface by known means.
14. At Station j the pattern is imprinted onto the surface of the glass panel by the electron beam. The electron beam "sensitizes" the surface atoms by directly altering their electrical and/or chemical properties.
15. The sensitized surface is exposed to positive ions such as $Sn^{++}$, $Pd^{++}$. The positively charged ions are attracted to negatively charged pattern areas where they deposit on and, adhere to the surface; but are repelled by positively charged areas. The positive ions do not adhere to surface areas having no charge, but way reflect elastically therefrom.
16. Tile surface is exposed to a metal vapor such as Cu or Al which may comprise positive ions of these metals. These ions are attracted to the previously retallized areas by an induced negative image charge. The thickness of the metal deposit is controlled by the metal vapor concentration and exposure time.
17. The patterns are formed with a gap S=25 to 100 A at locations where an asymmetric tunnel junction is to be placed. The pattern includes gaps 73, 25-100 A wide in the metal deposit.
18. The deposited metal is crystallized to single crystal by locally heating with an electron beam or laser, and then cooling to ambient temperature.
19. At station m+3 the gaps 73 in the metal pattern are ion coated in an ion coating device such as shown in FIG. 9. This provides the facing surfaces 81 and 82 of the gap 73 with two materials having different work functions $\phi_1/E$ and $\phi_2/E$.
20. The entire surface is then be coated with an insulator layer; for example, silicon dioxide, titanium dioxide, silicon nitride, and the like. The insulating material is chosen from one having a dielectric constant, such that the effective work functions are $\phi_1/$ and $\phi_2/$. [7; and copending U.S. Pat. application Ser. No. 637,405]. Conventional vapor coating techniques and apparatus may be used.
21. The sheet is again removed to atmospheric pressure through the airlocks 58, exiting at 56, Station n, s a finished product.

PROCESS B

FIG. 8 shows a device utilizing Process B. Process B takes place in two vacuum chambers 53 and 54, with a space 55 between them for stations for process steps at atmospheric pressure.

11. The process steps are the same as in Process A, to and including the electron beam writing step at Station j.
21. The sheet is removed from the second vacuum tube 53 into the atmosphere through the airlocks 56, and wet-processed with solutions which provide an electroless deposit of metal on the sensitized pattern areas. [8.1].
22. The sheet is then dried, and passed into a third vacuum tube 54 through the airlocks at Stations m to m+2.
23. From Stations m+2 to n−1, the steps are the same as in Process A, from 0.18 to 0.21 inclusive.

SURFACE CHEMISTRY OF GLASS

There is an electric double layer surface charge naturally existing on the surface of glass, which varies with glass composition [13-16 Incl.] The silica network is the most important in determining the surface charge. Most silicas have a population of silanol SiOH groups on the surfaces which may disassociate:

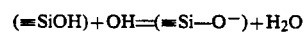

$(\equiv SiOH) + OH^- = (\equiv Si-O^-) + H_2O$

Tis forms negatively charged $\equiv Si-O^-$ groups in water, the greater, the pH, the greater the number of $\equiv Si-O^-$ groups formed. The pH for which $\zeta = 0$ is similar to that for other forms of silica pH=2 to 2.5).

The charge on the surface of the glass depends on the physical and chemical treatments to which it is subjected, as discussed in connection with the following Examples.

08.3.1  1 At Station 2 the glass surface is polished with Cerium Oxide.

2 At station 3 the surface is rinsed with distilled water.

3 At station 4 the sheet is dried at about 60° C. for about 10 minutes.

This process results in hydroxyl groups (—OH) attached to the glass surface ($\equiv Si$—OH) making the surface electronegative, and capable of reacting with positive ions in the vapor or liquid phases; such as $Sn^{++}$.

An alternate method is:

4 Expose the surface of glass to fuming sulphuric acid $H_2SO_4$ for a few minutes [24]

This process attaches a sulphonic group ($SO_3^=$) to the glass forming an electronegative surface charge on the surface ($\equiv Si \equiv SO_3$—)

In a similar manner the glass surface may be made electropositive:

5 At Station 4 the glass surface is exposed to a solution or vapor containing bifunctional electropositive groups such as: (—$NH_2^+$) which results in a glass surface with a positive charge having the composition $\equiv Si$—O—$NH_2^+$ A positive surface charge tends to repel positively charged ions and attract negatively charged ions from the vapor or solution. A third method is to render the glass surface charge neutral by utilizing reactive monofunctional atoms; such as a halogen, fluorine $-F$.

Figure 2:
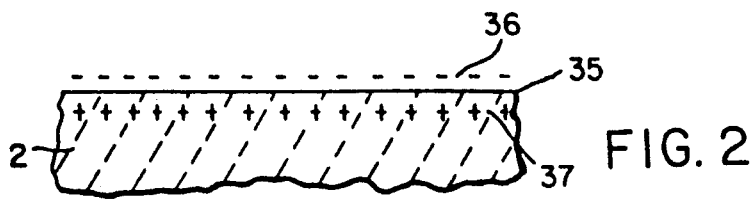
FIG. 2 shows a cross section through a glass plate having a surface electrical double layer, with the positive charges on the outside of the layer, with no pattern impressed.
Figure 3:
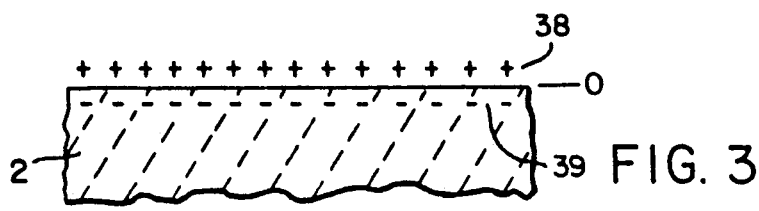
FIG. 3 shows a cross section through a glass plate having a surface electrical double layer, with a pattern impressed by a reversal of the sign of the charge layer.
Figure 4:
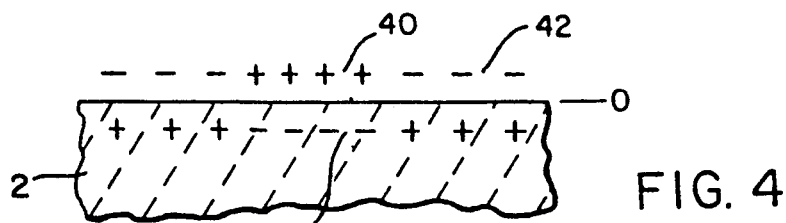
FIG. 4 shows a cross section through a glass plate having a surface electrical double layer, with the negative charges on the outside of the layer, a pattern being impressed by an electron beam onto adjacent areas of the surface which are thereby charged or not charged.
Figure 5:
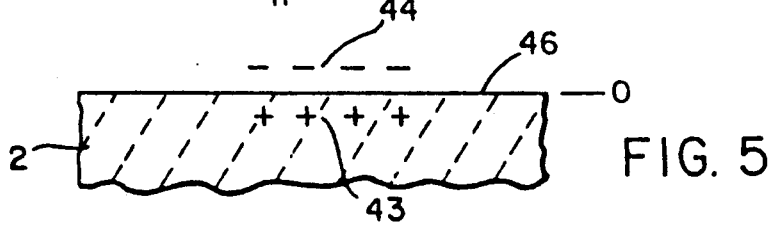
FIG. 5 shows a cross section through a glass plate having a surface electrical double layer, with the positive charges on the outside of the layer, a pattern being impressed by an electron beam onto adjacent areas of the surface which are thereby charged or not charged.

In the present invention the H atom in 0.3 above may be removed by an electron beam to form patterns on the glass surface, as shown in FIGS. 5 and 4, forming positively and negatively charged patterned areas. FIG. 2 shows a uniformly charged positive layer 38, and a negatively charged lower layer 39, on the glass surface O. FIG. 3 shows the same surface after a pattern has been created by the electron beam. The pattern appears as adjacent areas of charge reversal, 40 and 42; with the charges reversed at 41, 43 in the lower layer.

The surface chemistry of glass may be altered by for example heating.

Glass surfaces prepared in contact with water as in 0.1 to 0.3 above have Silanol groups; $\equiv$SiOH.

Such surfaces heated to $>400°$ C. give off water, adjacent group forming siloxane groups;

$$\equiv\text{SiOH}. \tag{08-1}$$

Such surfaces heated to $>400°$ C. give off water, adjacent group forming siloxane groups:

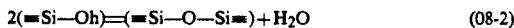
$$2(\equiv\text{Si}-\text{Oh})=(\equiv\text{Si}-\text{O}-\text{Si}\equiv)+H_2O \tag{08-2}$$

At 800° C. only a few silanol groups remain. At 1200° C. no silanol groups remain. On cooling surface rehydration is slow. Aging in water restores the hydrated state.

This invention may utilize an initial heating stage at Station 3 in which the temperature is maintained for a time at sufficiently high temperature to fully dehydrate the surface.

METAL PATTERN DEPOSITION

The pattern is inscribed by the electron beam writer described in the parent case see pate 1 (b) lines 1-5 incl. Metal is deposited on the pattern using Process A or Process B described in Section (g) 0.1 and 0.2, respectively.

In Process A, metal pattern deposition occurs from the ionic vapor in a vacuum onto charged surface areas that attract the metal ions and cause them to deposit. For example, as shown in FIG. 4, the electronegative portions of the pattern attract sn++ ions which sensitize only those areas. These ions may be produced by known methods [29-31 incl.]. A second ion source deposits Copper, for example, $Cu^{++}$ from the ionic vapor, onto the sensitized areas of the pattern.

In Process B, metal pattern deposition occurs at atmospheric pressure from solution, for example by electroless coating of Copper or other metals using known methods [18-24].

SINGLE CRYSTAL METAL GROWTH

The pattern may comprise a deposit of long, narrow thin metal strips, for example having dimensions 1000 A $\times$ 100 A $\times$ 50 A. The metal is preferably Copper, Aluminum or other metal having a long means free path for energetic electrons in a single crystal of the metal. A single metal crystal is essential to the best functioning of the device. At these dimensions metal particles may form single crystals spontaneously; but especially when heated and cooled. An electron beam may be employed to locally heat a plurality of the metal strips to induce their conversion to single crystals. [27, page 697].

ION DEPOSITION

An Ion Beam Device for producing an asymmetric Tunnel Junction is shown in FIG. 9. The cross section of an asymmetric tunnel junction on a substrate surface 0 is magnified to a scale of 10,000,000 to 1. Thus, in the drawing, the gap S=20 A measures 2 cm.

The asymmetric tunnel junction comprises a pattern of deposited metal layers 71, 72 of a metal $M_1$ of substrate surface O. There is a gap 72 between adjacent faces 74, 75 of the metal layers; for example, 20 to 100 A. Two or more ion sources 77 and 78 are provided to coat the gap faces with various materials 76, 81, 82 having different work functions $\phi_1$ to $\phi_2$. One of the metal faces of 71 may first be coated by the ion source 78 with a thin metal layer 76 of of a second metal $M_2$ a few atoms thick; then coated with said materials.

INSULATOR COATINGS

As a last step in the vacuum tube at Station $n-1$, insulator coatings are applied to the sheet, utilizing standard vapor coating or sputtering techniques and apparatus.

The insulator coating material is selected for its dielectric constant, $\epsilon$, to product effective work functions $\phi_1/\epsilon$, and $\phi_2/\epsilon$; in accordance with details given copending U.S. Pat. application Ser. No. 637,405 entitled "Femto Diode and Applications", now U.S. Pat. No. 4,720,642 issued Jan. 19, 1988.

At station n, electric connections may be made, and the surface of the sheet further protected by lamination to a second sheet of glass using known methods.

Figure 1:
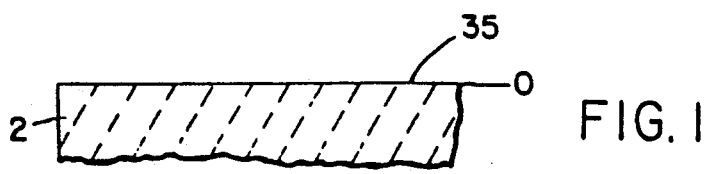
FIG. 1 shows a cross section through a glass plate having a surface electrical double layer, with the negative charges on the outside of the layer, with no pattern impressed.

FIGS. 0 to 2 show various continuous surface layer of noncharge and electric charge on which the pattern may be inscribed by the electron beam writer.

FIG. 0 shows a noncharged surface 35 comprising, for example, siloxane groups with no exposed reactive chemical radical. Such condition may be reached by heating the glass as previously described.

FIG. 1 shows a glass surface having a an electronegative charge layer 36 over an electropositive layer 37, forming a monomolecular electric double layer. The layer 36 may comprise, for example, sulphonic radicals, previously described herein.

FIG. 2 shows a glass surface with an electropositive surface layer 38, over an electronegative layer 39, forming a monomolecular electric double layer on the surface. The electropositive radical may be, for example an amino radial, previously described herein.

FIG. 3 shows a charge pattern inscribed by the electron beam, for example, in the charge structures shown in FIG. 2. In this case, the electron beam neutralizes an electropositive area and adds negative charge to reverse the charge pattern.

FIG. 4 shows a pattern inscribed by the electron beam which comprises adjacent negative charge - noncharge areas 44, 45 respectively.

Produced, for example by the electron beam breaking chemical bonds of the noncharged siloxane chains on the glass surface, exposing negative free bond of an oxygen atom.

FIG. 5 shows a noncharge-positive pattern 46, 67 respectively, produced by an electron beam on the electropositive surface layer 38 of FIG. 2. In this case the amino radicals, are neutralized or ablated and free oxygen bonds are taken to form noncharged surface areas of siloxane.

Figure 6:
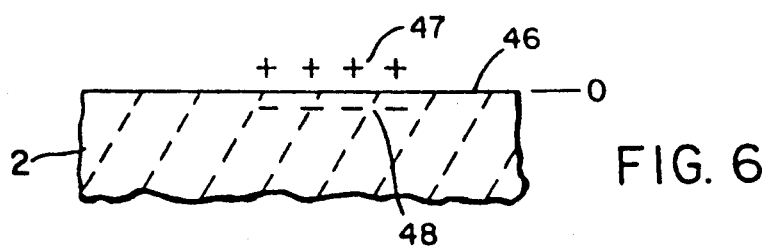
FIG. 6 shows a cross section through the glass plate and a back electrode, located in a Supersebtert during pattern inscription with an incident electron beam.

FIG. 6 shows a cross section through a substrate sheet O mounted on a base electrode 83 in an electron beans writer of this invention. The base electrode 83 may be connected to a positive voltage source to attract and discharge electrons driven through the sheet by the high velocity electrons in the beam.

Reverse current through the junction is constant, being limited by the junction structure and electric voltage. The forward current In the quantum regime is limited only by the Input rate of energy quanta. Hence the forward/reverse current ratio of the Femio Diode may be very large.

The tunnel junction used In the Femto Diode of this invention comprises an asymmetric Metal 1—Insulator—Metal—2 configuration. The first metal and its insulating interface has a work function $\phi_1$ in the range of 1.1 to 1.9 eV; and the second metal and its insulating interface has a work function $\phi_2$ in a range from 1.8 to 3.2 eV; A result of the analysis herein is that a maximum forward/reverse current occurs when $(\phi_1/\phi_2)\}0.6$. The insulating barrier has a thickness which depends on the selected current density; for example from 28 to 38 Å for a current density in the range 0.1 to 10 amps/cm$^2$. The dimensions of the facing metal surfaces are submicron, <100 Å×100 Å.

The tunnel function used in the Femto Diode of this invention facilitates the tunnelling transmission of an electron in the forward direction through the insulating barrier; and impedes the tunnelling transmission of an electron through the insulating barrier in the reverse direction. The total absorption of a light photon accelerates a single electron to a velocity determined by the energy of the photon.

The tunnel junction of the present invention is based upon the discovery of the particular values of the work functions $\phi_1$ and $\phi_2$ of metal 1 and 2, and their insulator interfaces, respectively; the barrier thickness s; and the cross-section A; for which the forward and reverse tunnel currents have a maximum ratio of about 14; and in which forward average current through the diode area of 50Å×50Å is about 2.2×10$^{-13}$ amps; and for which the average forward current density is about 0.88 amps.

The Femto Diode described herein has an efficiency of at least 90%, and is useful for many applications disclosed hereinafter.

The mathematical physics Section 9 which follows establishes the basic relationships and critical values required to construct a Femto Diode in accordance with the invention.

WORK FUNCTION

The work function of a metal is defined as the difference between the electric potential of an electron outside the surface ($-eV$) and the electron potential of an electron inside the same metal $$\phi = -eV - \mu$$

The work function $\phi$ is also the energy difference separating the top of the valence band (the Femio energy) from the bottom of the conduction band at the surface of the metal.

The work function of a metal can be changed by the adsorption of one or more monolayers of positive or negative ions at the metal surface to change the electric potential distribution. The change in the work function $\Delta\phi$ depends upon the crystal orientation of the metal surface, the chemical structure of the adsorbate ions, and the number of monolayers. The work function can increase or decrease depending on the nature of the adsorbate. The change in the work function also depends on the order in which the interface ions are deposited.

The dielectric constant $\epsilon$ of the insulator layer changes the work functions $\phi_1$ and $\phi_2$ on the adjacent metal faces to $(\phi_1/\epsilon)$ and $(\phi_2/\epsilon)$, respectively; whereby, the work function $*\phi_2/\epsilon)$ is adjusted to be approximately equal to the electron and photon energy; that is:

$$(\phi_2/\epsilon)^*eV$$

electron energy=hv photon energy enabling electron tunnelling and conversion of photon energy to electrical energy to occur at the corresponding wave-length.

Table II shows experimental data for the decrease in work function $\phi$ on various metal substrates for various absorbates. These combinations of materials are illustrative and not limiting.

TABLE II

Decrease of Work Functions for Metals[10] and Adsorbates
Experimental Data and References

| METAL | SYMBOL | CRYSTAL FACE | WORK FUNCTION | ADSORBATE | | RESULTING WORK FUNCTION | DECREASE IN WORK FUNCTION |
|---|---|---|---|---|---|---|---|
| | | | $\Phi$ | Material | Formula/ | $\Phi^1$ | $-\Delta\Phi$ |
| | | | eV | | Order of Deposition | eV | eV |
| Aluminum | Al | | 4.28 | Aluminum Oxide | $Al_2O_3$ on Al | 1.64 | 2.64 |
| | Al | | 4.28 | | Al on $Al_2O_3$ | 2.40 | 1.88 |
| Iridium | Ir | | 5.27 | Barium Oxide | BaO on Ir | 1.4 | 3.87 |
| Nickel | Ni | 100 | 5.15 | Sodium | Na on Ni | 2.15 | 3.00 |
| Nickel | Ni | 112 | 5.15 | Oxygen | $O_2$ on Ni | 4.15 | 1.0 |

For a specific wavelength $\mu$, expressed eV, the work function $e\phi_2 = eV$; or $\phi_2 = V$. It is shown in Section 9 that a peak ratio of $(j_2/j_1)$ or $\overline{R}/R$ occurs across the junction when $\phi_1 = 0.6$ $\phi_2 = 0.6V$. Table III illustrates this relationship for 3 wavelengths.

TABLE III

| | Wavelength versus work functions $\Phi_1$ $\Phi_2$ | | | INTERFACE | |
|---|---|---|---|---|---|
| COLOR | Wavelength | $V = \cdot\Phi_2$ | $\Phi_1$ | MATERIALS REF. | |
| | Å | eV | $0.6\Phi_2$ | $\Phi_2$ | $\Phi_1$ |
| RED | 7000 | 1.77 | 1.06 | 2-1 | 1-1 |
| GREEN | 6300 | 1.97 | 1.18 | 2-2 | 1-2 |

TABLE III-continued
Wavelength versus work functions $\Phi_1 \Phi_2$

| COLOR | Wavelength | $V = \Phi_2$ | $\Phi_1$ | INTERFACE MATERIALS | REF. |
|---|---|---|---|---|---|
| BLUE | 4000 | 3.10 | 1.86 | 2-3 | 1-3 |

The following Table IV illustrates the method of selecting metals to match the work functions listed in Table III for specific wavelengths.

TABLE IV
METHOD OF SELECTING INTERFACE MATERIALS

2-1 Work Function Required $\Phi_1 = 1.06$

| Adsorbate/Metal | $-\Delta\Phi$ Observed | required work function of metal $\Delta\Phi + \Phi_1 = \Phi_{M1}$ | metal selected from Table of Work Functions $\Phi_{M1}$ |
|---|---|---|---|
| BaO/Ir | 3.87 | 4.93 | Mo(111),Be,Co Ni(110) |
| Na/Ni | 3.00 | 4.06 | Al(110),Hf,In,M$\eta$ ,Z |
| Al$_2$O$_3$/Al | 2.64 | 3.70 | Mg,U |
| Al/Al$_2$O$_3$ | 1.88 | 2.94 | Tb, Y, Li, Gd |

2-1 Work Function Required $\Phi_2 = 1.77$

| Adsorbate/Metal | $-\Delta\Phi$ Observed | required work function of metal $\Delta\Phi + \Phi_2 = \Phi_{M2}$ | metal selected from Table of Work Functions $\Phi_{M2}$ |
|---|---|---|---|
| BaO/ir | 3.87 | 5.64 | Pt |
| Na/Ni | 3.00 | 4.77 | Ag(111) Fe(111) M |
| Al$_2$O$_3$/Al | 2.64 | 4.41 | Sn, Ta, W, Zr |
| Al/Al$_2$O$_3$ | 1.88 | 65 | Sc, Mg |

Tables II, III and IV illustrate selection principles which may be utilized to obtain the required values of $\phi_2$ and $\phi_1$ for a tunnel junction matched to a particular energy $eV = \phi_2$.

(1) Metals, absorbates, and the observed change in work function $\Delta\phi$ are listed in Table II.
(2) The work function of the metal surface is added to the decrease in work function $\Delta\phi$ produced by the adsorbate/interface to obtain the work function required for the metal.
(3) From the Table of Work Functions of the Elements, Candidate metals are selected which have a work function close to the required work function calculated in Table III.
(4) The order of deposition must be taken into account; for example: Ni/BaO or NaO/Ni For example: In Table (2-1) line 1, the metal selected Mo, Be, Co, Ni is tested with the adsorbate BaO such as: BaO/Ni; BaO/Co; etc.

The selection of material for a junction suited to each wavelength range has been illustrated with examples. Other combinations of materials may be employed for the metal surface: alloys, surfaces with ion implantation, semimetals such as bismuth and the like, and various crystal orientations.

Other materials may be employed for the adsorbate: metal oxides, alkali metals; the number of monolayers may be varied; and mixtures of absorbates may be used. The order of deposition may be varied to change $\Delta\phi$.

The selection of materials for tunnel junctions having the requisite work functions $\phi_2$ and $\phi_1$ for each wavelength range may be made to meet these requirements using the available materials and techniques described above; or modifications thereon, which are within the purview of this invention, and may be varied without departing from the scope hereof.

The device is simple and inexpensive. It utilizes a readily available amorphous substrate such as glass, although it is not limited thereto, It does however require precision fabrication In a submicron facility. Electron beams may be employed to produce the extremely small structures required. Xray or electron beam lithography may be employed to produce the masks. Ion beams or molecular beam epitaxy may be used to lay down the appropriate metal and insulating areas in a manner known to the art of producing submicron electronic devices. The insulating layer may be silicon dioxide, aluminum oxide, or other Insulating layers known to the art. The metal cylinder may be a single crystal which may form spontaneously in such small dimensions or which may be induced to crystallize by suitably heating and cooling the coating, and/or by the momentary application of electric or magnetic fields, and/or by epitaxial growth an a crystalline substrate. The metal cylinder may have any cross-section but is preferably square or rectangular high purity single crystal having a long means free time; such as tungsten, for which $\tau = 1.6 \times 10^{-13}$ sec.

The laws of physics which apply to large-scale electrical circuits in the macro regime are different from the quantum electrodynamic laws of physics In the quantum regime. Because of the small current and time intervals concerned, individual electrons are utilized one at a time. In a Femto Diode, a single electron approaches the barrier travelling over submicron distances-with an energy $\epsilon = h\nu = Ve$. Consequently, no charge cloud forms at the insulating barrier, and there is therefore no capacitance effect. The time constant equation is therefore not applicable to the submicron diode of the invention.

The penetration of a barrier by an electron possessing an energy eV slightly less than the barrier potential $e\phi$ occurs according to quantum mechanics by an effect known as "electron tunnelling through a barrier". According to the quantum theory of tunnelling, an electron moving in a metal approaching an insulating barrier, either passes through the barrier to the metal on the other side by "tunnelling"; or is totally repelled by the electric field potential at the barrier/metal interface, and reverses its direction of motion. This is illustrated in FIG. 5. The waves shown are transmission/reflection probability waves, not actual particles.

According to the well-established theory, the effect occurs because an electron has a probability wave function which extends a considerable distance and penetrates a thin barrier (s°30Å). The probability of transmission of an electron passing through the barrier depends on various parameters, which are defined in the mathematical equations derived from fundamental considerations.

The passage of the electron through the barrier occurs because the location of an electron in space is indeterminate, expressed as a probability wave function of the electron being in a given position. This wave function extends over a distance of at least 100 Å which is greater than the thickness s of the insulating barrier; usually 28 to 38 Å for a Femto Diode.

The electron penetrates the insulating barrier because its position along the axis normal to the plane of the barrier is described by a probability law derived from the Schrodinger equation, from which the Tunnel Transmittance Equation was derived.

The electron may penetrate the barrier and appear on the other side, with its kinetic energy now converted to an equal quantity of potential energy; or, the electron may be reflected, and reverse its direction without loss of energy. In this invention the Femto Diode is usually attached to a lossless resonant well step antenna, line or stub. A single electron oscillates back and forth in the well without loss of energy until it passes through the barrier.

These phenomena occur without less because there are no electron collisions, and in the reversal of direction, the initial and final velocities of the electron are equal and opposite.

In this region the effective mass * of an electron may be about 0.01 $m_e$ the rest mass of an electron. Hence, in a metal, the electron velocity increase from a given quanta of energy is greater than that of an electron in free space. 6.1,6.2,14.2,15.1.

As an example, the current through a Femto Diode may be about $1.6 \times 10^{-13}$ amps; for which the number of single electrons/sec is: $N = 10^6$ electron/sec; or 1 electron per $\mu$ sec. These are single electron events.

REFERENCES

[7] DIELECTRIC CONSTANTS OF CERAMICS, Table includes:
 Dielectric Strength v/mil
 Volume Resistivity ohm-cm @23° C.
  CRC Handbook of Chemistry and Physica
  Page E-55, 65th Edition, 1985
   CRC Press, Inc.
   Boca Raton, FL
[8] U.S. Pat. No. 4,720,642 issued Jan. 19, 1988 to Alvin M. Marks
 [8.1] Cols. 5-8 incl.
[9] The Principles and Practice of Electron Microscopy
 Ian M. Watt
 Cambridge University Press; 1985
  Pages 10-19 incl.; particularly page 13.
[10] Transmission Electron Microscopy
 Physics of Image Formation and Micro Analysis
 Reimer, Ludwig
 Springer-Verlag
 Berlin Heidelberg New York Tokyo 1984
  Page 88 Table 4.1 Field Emission cathode
  Pate 88 Table 4.1 Field Emission Cathode Data
  pages 104-105 Spherical Aberration and Error Disc
  Pages 122-123 Field Emission Scanning Transmission Electron Microscope
  Pages 272-273 Electron Spread in Thin Specimens
  Pages 284-285 Grid and Anode Electrodes with Field Emitting Electrode.
[11] Experimental High Resolution Electron Microscopy
 John. C. H. Spence
 Clarenden Press Oxford 1981
 Chapter 2, Electron Optics, pages 28-59
[12] Atomic Resolution of TEM Images of Surfaces
 The newest Electron Microscopes that crack the 2 Angstrom barrier can resolve atom positions on metal and semiconductor surfaces.
 Robinson, Arthur L.
 Science, Vol. 230 pages 304-306
[13] Dynamic Atomic-Level Rearrangements in Small Gold Particles.
 Smith, Petford-Long, Wallenberg and Bovin
 Science Volume 233,
 Pages 872-874
[14] Discharges and Mechanoelectrical Phenomena in Charged Glasses
 Vorob'ev, Zavadovskaya, Starodubstev, and Federov
 S. M. Korov Tomsk Polytechic Institute
 Izvestiya Vishhikh Uchebnykh Zavedenii Fizika
 No. 2, pp 40-46 February 1977
[15] Electret Effect in Silica Glass containing Two Types of Alkaline Ions
 E. Rsiakiewicz-Pasek
 Institute of Physics,
 Technical University of Wroclaw, Poland
 Journal of Electrostatics, 16(1984) 123-125
 Elseview Science Publishers B.
[16] Surface Charges in a Zinc Borosilicate Glass-/Silicon System
 Misawa, Hachino, Haa, Ogawa and Yagi
 Hitachi, Ibaraki, Japan
 J. Electrochem Soc.
 SOLID STATE SCIENCE AND TECHNOLOGY
 pp. 614-616, March 1981
[17] Surface Charge of Vitreous and Silicate Glasses in Aqueous Electrolyte Solutions
 Horn and Onoda
 Journal of The American Ceramic Society
 pages 523-527, Vol. 61 No. 11-12, Nov.-Dec. 1978
[18] Electroless Deposit of Cuprous Oxide
 Greenberg and Greininger
 J. Electrchem. Soc.: Electrochemical Science and Technology
 pages 1681-1785, Vol. 124, No. 11, Nov. 1977
[19] A Copper Mirror: Electroless Plating of copper
 Hill, Foss and Scott
 University of Wisconsin, River Falls, WI, 54022
 Journal of Chemical Education
 Page 752, Vol. 19
[20] Comparison of Stannous and Stannic Chloride a Sensitizing Agents in the Electroless of Silver on Glass Using X-Ray Photoelectron Spectroscopy
 Pederson, L. R.
 Solar Energy Materials
 Pages 221-232, 6, 1982
 North Holland Publishing Company
[21] Electroless Gold Plating—Current Status
 Yutaka Okinaka
 Abstract No. 441
 Bell communications research, Inc.
 600 Mountain Avenue
 Murray Hill, NJ 07974
[22] AuotCatalytic Deposition of gold and Tin
 A. Molenaar
 Abstract No. 442
 Philips Research Laboratories
 5600 JA Eindhoven
 The Netherlands
[23] Anodic Oxidation of Reductants in Electroless Plating
 Ono and Haruyama
 Abstract No. 444
 Tokyo Institute of Technology
 Graduate School at Nagatsuta
 Midori ku, Yokohama 27,Japan
[24] Application of Mixed Potential Theory and the Interdependence of Partial Reactions in Electroless Copper Deposition
 Bindra David and Roldan
 Abstract No. 445
 IBM Thomas J. Watson Research Center
 P.O. Box 218
 Yorktown Heights, NY 10598

[25] Transparent Plastic Articles having Ammonium Sulphonic Acid Groups on the Surface thereof and Methods for their Production
- U.S. Pat. No. 3,625,751
- Issued Dec. 7, 1971
- Wilhelm E. Walles

[26] Barrier Plastic Articles
- U.S. Pat. No. 3,916,048
- Issued Oct. 28, 1975
- Wilhelm E. Walles

[27] Laser and Electron Beam Processing of Materials
- Edited by C. W. White
- Solid State Division
- Oak Ridge National Laboratory
- Oak Ridge, TN
- P.S. Peercy
- Division 5112
- Sandia Laboratories

| Academic Press, New York, N.Y., 1980 | |
|---|---|
| Pages 18–19 | Fundamental Mechanisms |
| Pages 65–69 | Melting by Pulsed Laser Irradiation |
| Pages 671–677 | Laser Induced Photochemical Reaction for Electronic Device Fabrication |
| Pages 691–699 | Metastable Surface Alloys |
| Page 697 | Crystallization of Copper from the melt using electron beam |

[28] Fine Focused Ion Beam System using Liquid Metal Alloy Ion Sources and Maskless Fabrication
- Gamo, Inomoto, Ochiai and Namba
- Faculty of Engineering Science
- Osaka University
- Toyonaka, Osaka 560, Japan
- Pages 422–433

[29] Microscopy and Lithography with Liquid Metal Ion Sources
- Cleaver, J. R. A.
- Department of Engineering
- Cambridge University,
- England
- Pages 461–466
- Inst. Phys. Conf. Ser. No. 68: Chapter 12
- EMAG, Guildford, Aug. 30,–Sep. 2, 1983

[31] Electrohydrodynamic Ion Source
- Mahoney, Yahiku, Daley, Moore and Perel
- Pages 5101–5106
- Journal of Applied Physics
- Vol. 40, No. 13, Dec. 1969

[32] Stable and Metastable Metal Surfaces
- Spencer M. S.
- Pages 685–687
- Nature Vol. 323, 23 October 1986

[33] Electrons in Silicon Microstructures
- Howard, Jacket, Mankiewich, and Skocpol
- Pages 346–349
- Science Vol. 231, 24 Jan. 1986

[34] Atomic-Resolution of TEM Images of Surfaces
- Robinson, Arthur L.
- Pages 304–306
- Science vol. 230, 18 Oct. 1984

[35] Time-Resolved Electron Energy Loss Spectroscopy
- Ellis, Dubois, Kevin and Cardillo
- Pages 256-26
- Science, Vol. 230, 18 Oct. 1985

[36] Optical Holography
- Collier, Burchkhardt and Lin
- Bell Telephone Laboratories
- Pages 300–301
- Academic Press, New York, NY, 1971

I do not wish to be limited by the examples and illustrations of this invention given herein. Various modifications may be made by those skilled in the art without departing from the scope of these inventions and the claims appended hereto.

Having fully described my invention, what I now wish to claim is:

1. A process for the simultaneous inscription of multiple submicron patterns onto a substrate sheet, comprising the steps of preparing a clean flat surface on said sheet, treating the surface of said sheet to sensitize it to an electron beam, placing said sheet in a vacuum device, simultaneously scanning a plurality of electron beams onto said surface, electrically controlling said electron beams by a programmed microprocessor to form a plurality of said patterns on said surface, depositing a metal coating on said patterned areas, coating said patterns with an insulator coating, and removing said sheet from said vacuum device.

2. A process according to claim 1, for the simultaneous inscription of multiple submicron patterns onto a substrate sheet surface in which said step of sensitizing said surface consists of depositing a monoatomic or monomolecular layer on said surface, said layer having an electric double layer existing therewith, and in which said patterns exist as adjacent areas of charge, charge reversal or no charge.

3. A process according to claim 1 in which said metal is deposited on said surface from an electroless solution.

* * * * *